United States Patent
Reitsma

(10) Patent No.: US 9,810,744 B2
(45) Date of Patent: Nov. 7, 2017

(54) RESONANT INDUCTIVE SENSING WITH REDUCED NOISE FOLDING

(71) Applicant: Texas Instruments Incorporated, Dallas, TX (US)

(72) Inventor: George P. Reitsma, Redwood City, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 80 days.

(21) Appl. No.: 14/585,285

(22) Filed: Dec. 30, 2014

(65) Prior Publication Data

US 2015/0188522 A1   Jul. 2, 2015

Related U.S. Application Data

(60) Provisional application No. 61/922,897, filed on Jan. 2, 2014.

(51) Int. Cl.

| | |
|---|---|
| *G01R 27/02* | (2006.01) |
| *G01R 33/00* | (2006.01) |
| *G01R 33/06* | (2006.01) |
| *H03K 5/1252* | (2006.01) |

(52) U.S. Cl.
CPC ....... *G01R 33/0023* (2013.01); *G01R 33/063* (2013.01); *H03K 5/1252* (2013.01)

(58) Field of Classification Search
CPC ..... G01R 33/0023; G01R 27/02; H03K 3/012
USPC ....................................................... 327/108
See application file for complete search history.

(56) References Cited

U.S. PATENT DOCUMENTS

| | | | | |
|---|---|---|---|---|
| 3,753,143 A | * | 8/1973 | Aguirre .............. | G11B 20/1403 327/156 |
| 6,225,872 B1 | * | 5/2001 | Verhoeven ............... | H03B 5/32 331/116 R |
| 6,479,986 B1 | * | 11/2002 | Steinich ................... | G01D 3/02 324/202 |
| 6,970,496 B1 | * | 11/2005 | Ben-Bassat ........ | H04B 1/70712 329/313 |
| 2002/0089387 A1 | * | 7/2002 | Grewing .................. | H03C 3/22 331/177 V |
| 2003/0151931 A1 | * | 8/2003 | Kohno ................ | H02M 7/5381 363/22 |

(Continued)

*Primary Examiner* — Giovanni Astacio-Oquendo
*Assistant Examiner* — Alvaro Fortich
(74) *Attorney, Agent, or Firm* — Andrew Viger; Charles A. Brill; Frank D. Cimino

(57) ABSTRACT

A resonant inductive sensing system includes in the drive current signal path of the resonator a pulse shaper for noise reduction, including reducing noise resulting from down modulation of signal energy around harmonics of the oscillator (multiples of the resonance frequency), and from uncertainty in the duration of the oscillation period. The pulse shaper is configured so that, for each modulation period of the drive current, consecutive drive current pulses are substantially identical. In example embodiments, an inductance-to-digital conversion (IDC) unit includes drive circuitry configured to drive excitation current pulses to the resonator with a modulation period synchronized with a resonator oscillation frequency, and pulse shaping circuitry configured to pulse shape the drive current pulses so that each pair of drive current pulses within a modulation period are substantially identical.

15 Claims, 2 Drawing Sheets

(56) References Cited

U.S. PATENT DOCUMENTS

| | | | |
|---|---|---|---|
| 2003/0231038 A1* | 12/2003 | Koch, II | H03K 5/12 |
| | | | 327/170 |
| 2004/0108910 A1* | 6/2004 | Feilkas | H03B 5/04 |
| | | | 331/117 R |
| 2007/0139040 A1* | 6/2007 | Jones | D06F 39/003 |
| | | | 324/207.17 |
| 2008/0116883 A1* | 5/2008 | Ruehl | G01D 5/2093 |
| | | | 324/207.17 |
| 2008/0276722 A1* | 11/2008 | Wiedmann | G01F 1/40 |
| | | | 73/861 |
| 2014/0107969 A1* | 4/2014 | Hsu | G01C 19/5712 |
| | | | 702/145 |

* cited by examiner

RESONANT INDUCTIVE SENSING WITH REDUCED NOISE FOLDING

CROSS-REFERENCE TO RELATED APPLICATIONS

Priority is claimed under USC §119(e) to U.S. Provisional Application 61/922,897, filed 2 Jan. 2013.

BACKGROUND

Technical Field

This Patent Disclosure relates generally to resonant inductive sensors and sensing, such as can be used in sensing position, proximity or physical state or condition.

Related Art

A resonant sensor includes a resonator configured for operation in a resonance state (resonant frequency and amplitude). Sensor electronics drives the resonator with an AC excitation current synchronized with resonator oscillation voltage to maintain resonance (steady state oscillation), overcoming a resonator loss factor represented by a resonator impedance (such as series/parallel resistance Rs/Rp). For example, in the case of inductive sensing, the resonator includes an inductive sensing coil that, operated at resonance, projects a magnetic sensing field.

Resonant sensing is based on changes in resonance state manifested by, for example, changes in resonator oscillation amplitude and frequency resulting from changes in resonator impedance in response to a conductive target. For example, in case of inductive sensing, resonance is affected by a storage or loss in projected magnetic flux energy output from the inductive sensing coil, such as caused by the eddy current effect associated with a conductive target. This sensor response is manifested as a change in resonator impedance (loss factor Rs/Rp).

BRIEF SUMMARY

This Brief Summary is provided as a general introduction to the Disclosure provided by the Detailed Description and Figures, summarizing some aspects and features of the Disclosure. It is not a complete overview of the Disclosure, and should not be interpreted as identifying key elements or features of the invention, or otherwise characterizing or delimiting the scope of the invention disclosed in this Patent Document.

The Disclosure is directed to the problem of sensing using a resonant sensor, such as for sensing position, proximity or physical state or condition, and more particularly to the problem of noise appearing at harmonics of the resonant sensor. The Disclosure describes apparatus and methods for resonant inductive sensing resonant inductive sensing with drive current pulse shaping to reduce noise folding.

According to aspects of the Disclosure, a methodology for resonant inductive sensing resonant inductive sensing includes driving excitation current pulses to the resonator with a modulation period synchronized with a resonator oscillation frequency, and pulse shaping the drive current pulses so that that each pair of drive current pulses within a modulation period are substantially identical.

In described examples, pulse shaping attenuates noise due to down modulation of signal energy around harmonics of the resonator oscillation frequency, and attenuates noise due to uncertainty in the duration of the modulation period.

Other aspects and features of the invention claimed in this Patent Document will be apparent to those skilled in the art from the following Disclosure.

DESCRIPTION

This Description and the Figures constitute a Disclosure of example embodiments and applications that illustrate various features and advantages of resonant inductive sensing with drive current pulse shaping to reduce noise folding.

In brief overview, a resonant inductive sensing system includes in the drive current signal path of the resonator a pulse shaper for noise reduction, including reducing noise resulting from down modulation of signal energy around harmonics of the oscillator (multiples of the resonance frequency), and from uncertainty in the duration of the oscillation period. The pulse shaper is configured so that, for each modulation period of the drive current, consecutive drive current pulses are substantially identical.

In example embodiments, a resonant inductive sensing system includes an inductive resonator and an inductance-to-digital conversion (IDC) unit. The IDC unit includes drive circuitry configured to drive excitation current pulses to the resonator with a modulation period synchronized with a resonator oscillation frequency, and pulse shaping circuitry configured to pulse shape the drive current pulses so that each pair of drive current pulses within a modulation period are substantially identical.

In example embodiments, the pulse shaper can be configured to attenuate noise due to down modulation of signal energy around harmonics of the resonator oscillation frequency, and due to uncertainty in the duration of the modulation period.

Figure 1:
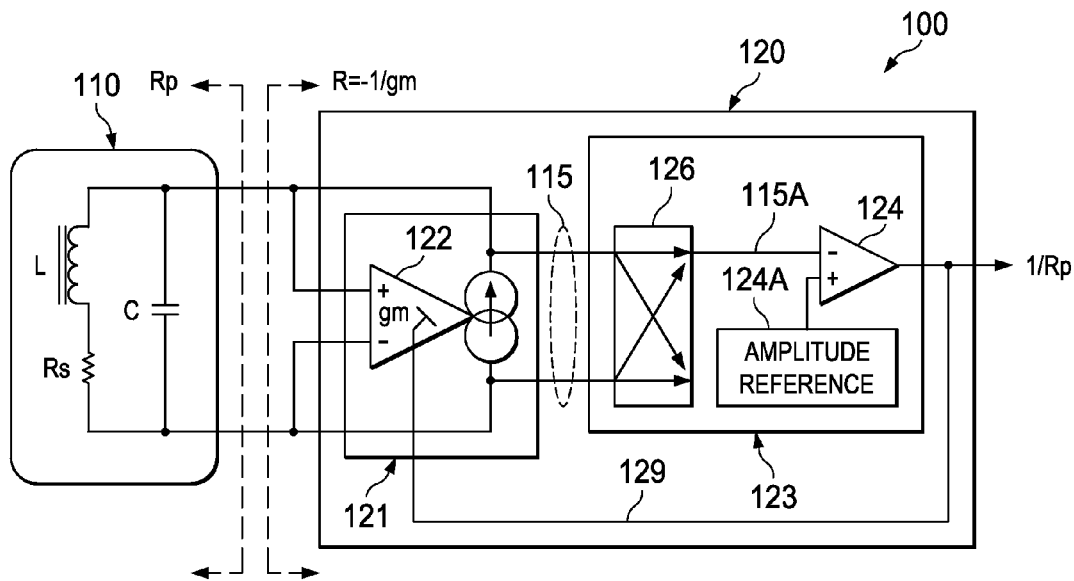
FIG. 1 illustrates an example embodiment of a resonant inductive sensor that includes an LC resonator driven by excitation current from an inductance-to-digital (IDC) converter, synchronized with resonator oscillation voltage (at a resonator oscillation frequency).

FIG. 1 illustrates an example embodiment of a resonant inductive sensor 100. Sensor 100 includes an LC resonator 110 with a loss factor represented by Rs and an inductance-to-digital (IDC) converter 120. Loss factor Rs equates to an equivalent parallel resistance/impedance Rp.

In an example application, sensor 100 can be used for proximity/position sensing of a conductive target. A proximate conductive target (within the sensing range of sensor 100) will cause a change in resonant impedance (loss factor Rs/Rp), which is detected by IDC 120.

IDC 120 drives resonator 110 with an AC excitation current synchronized with the oscillation frequency of the resonator. IDC 120 includes a negative impedance stage 121 and a loop control stage 123, establishing a negative impedance control loop that includes resonator 110 as a low pass loop filter. The IDC negative impedance control loop drives resonator 110 with a negative impedance to maintain resonator oscillation amplitude constant (steady-state oscillation).

Negative impedance stage 121 drives resonator 110 with excitation current pulses (current levels), synchronized with resonator oscillation voltage, with a loop-controlled negative impedance. Loop control stage 123 monitors resonator oscillation amplitude (115), and provides to the negative impedance stage 121 a feedback loop control signal 129 that controls negative impedance to maintain resonator oscillation amplitude constant. A constant resonator oscillation amplitude corresponds to steady state oscillation, with negative impedance/resistance balancing resonator impedance/resistance (Rs/Rp loss factor).

Negative impedance stage 121 can be implemented as a trans-admittance amplifier 122 with a controlled trans-admittance (gm). Trans-admittance amplifier 122 drives resonator 110 with excitation/drive current synchronized with resonator oscillation voltage (input to the trans-admittance amplifier), with negative impedance controlled by the feedback loop control signal 129 from loop control stage 123.

Loop control stage 123 can be represented by an amplifier 124 and a rectifier 126. Amplifier 124 provides the gm_admittance loop control signal 129 based on the rectified resonator oscillation amplitude 115A and an amplitude reference 124A. That is, loop control 123 responds to resonator oscillation amplitude 115/115A, generating a gm_amplitude control signal 129 to modulate/tune gm (admittance) of amplifier 122, controlling negative impedance to maintain resonator oscillation amplitude constant.

IDC 120 outputs sensor response data corresponding to the gm_amplitude loop control signal 129 that controls negative impedance (1/Rp, where Rp=L/(C*Rs)). Sensor response data quantifies changes in negative impedance corresponding to changes in resonant impedance (Rs/Rp), such as resulting from a proximate conductive target.

Figure 2:
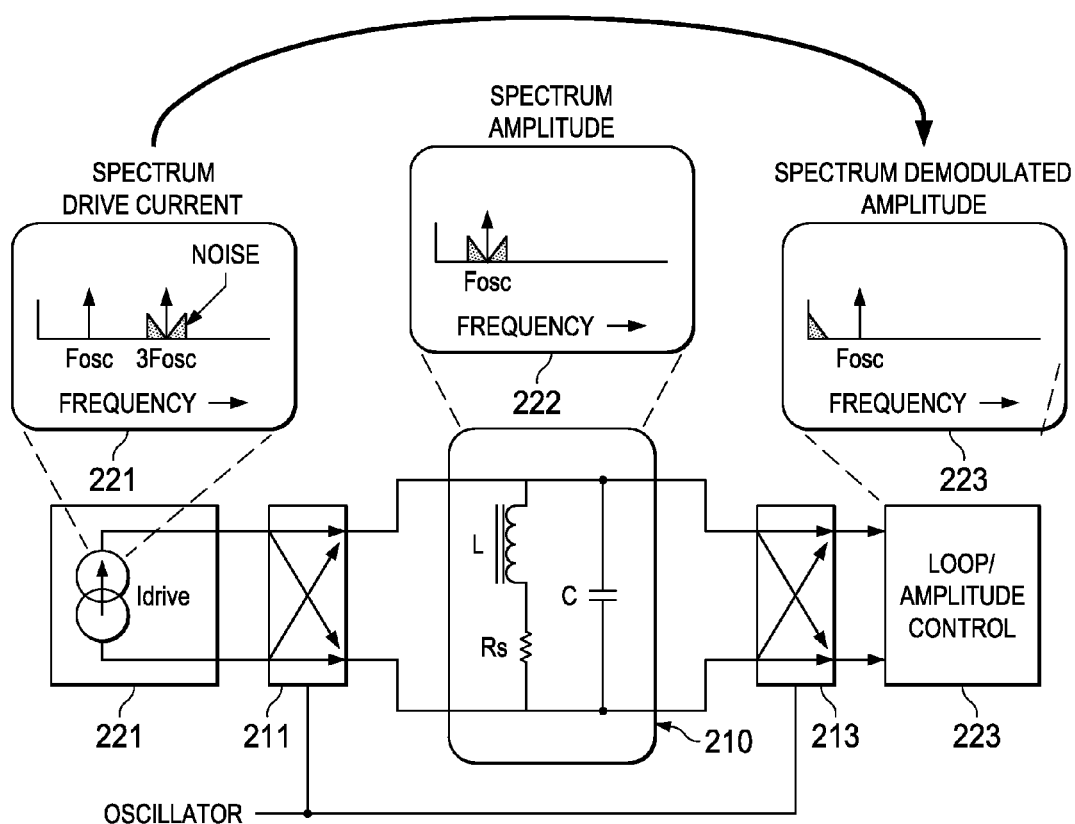
FIG. 2 illustrates an example functional embodiment of the resonant inductive sensor of FIG. 1, illustrating signal modulation, including noise modulation in connection with driving an LC resonator.

FIG. 2 illustrates an example functional embodiment of the resonant inductive sensor 100 of FIG. 1. A resonant sensor 210 is driven with excitation current pulses from current drive 221. The drive current must be synchronized with the voltage across resonator 210, and therefore must be modulated synchronously with resonator oscillation frequency.

Resonator 210 is functionally illustrated with input and output modulators 311/313. Current drive 221 drives excitation current pulses modulated by input modulator 211 at the oscillation frequency of the resonator. Output modulator 213 rectifies (or samples) resonator voltage amplitude for input to loop control 223. Referring to FIG. 1, IDC 120 detects resonator oscillation amplitude, and provides loop control (gm/amplitude control 129) to maintain resonator oscillation amplitude constant.

Frequency plots 221, 222, 223 illustrate signal modulation for the drive current, including noise modulation. Functionally, input modulator 211 synchronizes drive current 221 with the resonator voltage, modulating any signal around harmonics of the oscillation frequency down to the fundamental (221-222). Resonator 210 effectively band pass filters signal energy outside of the band around the fundamental (222). Output modulator, providing rectification (or sampling), effectively modulates all signal power around the fundamental down to baseband (223).

That is, frequency plots 221, 222, 223 illustrate that any signal located at a multiple of the resonance frequency will be modulated down to fundamental (222), and then to baseband (223). In particular, noise present at multiples of the oscillator frequencies (221) will also be down modulated to baseband (222-223).

This noise folding interferes with loop control 223. The accuracy of loop control 223, which determines the accuracy of measuring sensor response, is based on accurately detecting changes in resonator oscillation amplitude. Noise present at harmonics of the oscillator frequencies, particularly noise in the drive current, down modulates to amplitude noise that is injected into control loop 223.

Figure 3:
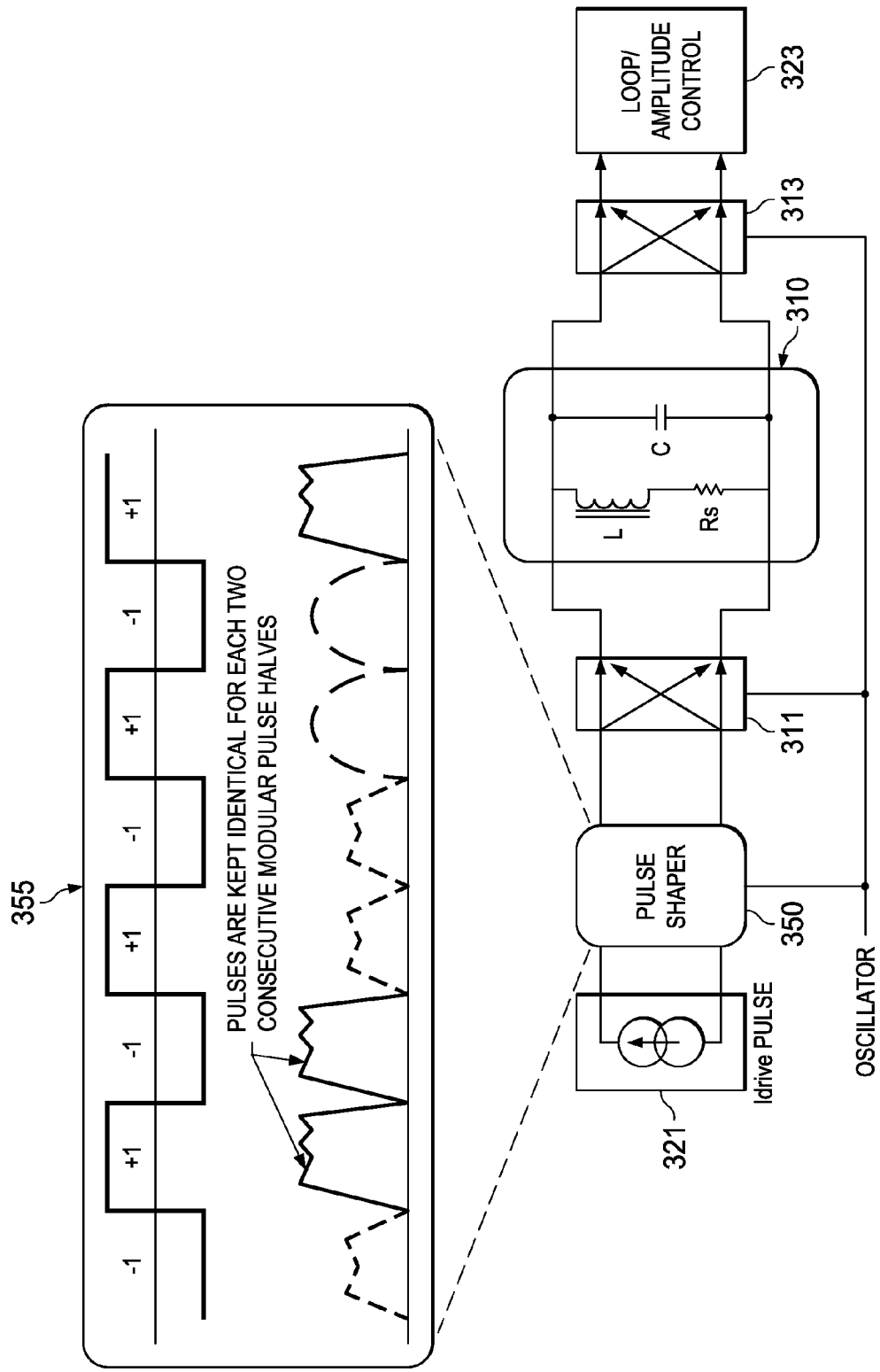
FIG. 3 illustrates an example functional embodiment of the resonant inductive sensor of FIG. 1, including a pulse shaper in the signal path driving an LC resonator, providing noise reduction including reducing down modulating noise appearing at multiples of the resonance oscillation frequency (reducing noise folding).

FIG. 3 illustrates an example functional embodiment of the resonant inductive sensor 100 of FIG. 1. For noise reduction, a pulse shaper 350/355 is introduced into the drive current signal path for resonator 310.

Resonator 310 is functionally illustrated with input and output modulators 311/313. Current drive 321 provides excitation current pulses that are modulated by input modulator 311 to drive resonator 310. Output modulator 313 rectifies (or samples) resonator oscillation amplitude for input to loop control 323. Referring to FIG. 1, IDC 120 detects resonator oscillation amplitude, and provides loop control (gm/amplitude control 129) to maintain a constant resonator oscillation amplitude.

Pulse shaper 350/355 functions to reduce down modulation of noise by eliminating or substantially attenuating signal energy around harmonics of the oscillator. That is, pulse shaper 350/355 reduces noise folding by reducing down modulation of noise appearing at multiples of the resonance oscillation frequency.

Pulse shaper 350/355 is not a filter, but instead, as illustrated by waveforms 355, shapes the excitation current pulses from current drive 321, such that any two consecutive pulses are substantially identical (within a drive/excitation period), and relatively insensitive to uncertainly in the duration of each period. Each pulse is synchronized to half a period of the modulator. The particular shape of any one pulse is not determinative—the function of the pulse shaper is that a pulse pair (one pulse for each half period) consists of two substantially identical pulses. In effect, the modulator acts as interpolation filter that does not affect the spectrum. Hence, no noise power is modulated up or down.

In other example embodiments, pulse shaper 350/355 can be combined with filtering. For example, pulse shaper 350/355 can be combined with a comb filter with high attenuation at any of the higher harmonics of the fundamental frequency. Alternatively, low pass filtering can be used to attenuate signal energy above the fundamental.

The Disclosure provided by this Description and the Figures sets forth example embodiments and applications, including associated operations and methods that illustrate various aspects and features of the invention. Known circuits, functions and operations are not described in detail to avoid unnecessarily obscuring the principles and features of the invention. These example embodiments and applications can be used by those skilled in the art as a basis for design modifications, substitutions and alternatives to construct other embodiments, including adaptations for other applications. Accordingly, this Description does not limit the scope of the invention, which is defined by the Claims.

The invention claimed is:
1. A circuit suitable for use in resonant inductive sensing, comprising:
   input/output nodes coupleable to an inductive resonator;
   drive circuitry to drive excitation current pulses out of the input/output nodes with a modulation period synchronized with a resonator oscillation frequency; and pulse shaping circuitry to pulse shape the excitation current pulses so that each pair of excitation current pulses within the modulation period are identical.

2. The circuit of claim 1, wherein the pulse shaping circuitry attenuates noise due to down modulation of signal energy around harmonics of the resonator oscillation frequency.

3. The circuit of claim 2, wherein the pulse shaping circuitry attenuates noise due to uncertainty in the duration of the modulation period.

4. The circuit of claim 1, further including filter circuitry to filter the excitation current pulses to attenuate signal energy at a one or more harmonics of the oscillation frequency.

5. The circuit of claim 1;
wherein the drive circuitry comprises negative impedance circuitry coupled to the resonator, to drive excitation current pulses with a negative impedance that is controlled in response to an impedance control signal; and
further comprising loop control circuitry to generate the impedance control signal based on resonator oscillation amplitude, such that the controlled negative impedance substantially cancels a resonator loss factor impedance, thereby maintaining a resonator oscillation amplitude corresponding to the resonator oscillation frequency.

6. A system suitable for resonant inductive sensing, comprising:
an inductive resonator; and
an inductance-to-digital conversion IDC unit, including
drive circuitry to drive excitation current pulses to the resonator with a modulation period synchronized with a resonator oscillation frequency; and
pulse shaping circuitry to pulse shape the excitation current pulses so that each pair of drive current pulses within the modulation period are identical.

7. The system of claim 6, wherein the pulse shaping circuitry attenuates noise due to down modulation of signal energy around harmonics of the resonator oscillation frequency.

8. The system of claim 7, wherein the pulse shaping circuitry attenuates noise due to uncertainty in the duration of the modulation period.

9. The system of claim 6, wherein the IDC unit further includes filter circuitry to filter the excitation current pulses to attenuate signal energy at a one or more harmonics of the oscillation frequency.

10. The system of claim 6,
wherein the drive circuitry comprises negative impedance circuitry coupled to the resonator, to drive excitation current pulses with a negative impedance that is controlled in response to an impedance control signal; and
wherein the IDC unit further includes loop control circuitry to generate the impedance control signal based on resonator oscillation amplitude, such that the controlled negative impedance cancels a resonator loss factor impedance, thereby maintaining a resonator oscillation amplitude corresponding to the resonator oscillation frequency.

11. A method, useable for resonant inductive sensing with an inductive resonator, comprising:
driving excitation current pulses to the resonator with a modulation period synchronized with a resonator oscillation frequency; and
pulse shaping the excitation current pulses so that that each pair of drive current pulses within the modulation period are identical.

12. The method of claim 11, wherein the pulse shaping attenuates noise due to down modulation of signal energy around harmonics of the resonator oscillation frequency.

13. The method of claim 12, wherein pulse shaping attenuates noise due to uncertainty in the duration of the modulation period.

14. The method of claim 11, further comprising filtering the drive current pulses to attenuate signal energy at a one or more harmonics of the oscillation frequency.

15. The method of claim 11,
wherein the driving excitation current pulses is accomplished by driving excitation current pulses with a negative impedance that is controlled in response to an impedance control signal; and
further comprising generating the impedance control signal based on resonator oscillation amplitude, such that the controlled negative impedance cancels a resonator loss factor impedance, thereby maintaining a resonator oscillation amplitude corresponding to the resonator oscillation frequency.

\* \* \* \* \*